(12) United States Patent
Hsu et al.

(10) Patent No.: US 8,494,108 B2
(45) Date of Patent: Jul. 23, 2013

(54) SWITCH DEVICE AND SHIFT REGISTER CIRCUIT USING THE SAME

(75) Inventors: Kuo-Hua Hsu, Hsin-Chu (TW); Yung-Chih Chen, Hsin-Chu (TW); Chun-Huan Chang, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/186,489

(22) Filed: Jul. 20, 2011

(65) Prior Publication Data
US 2012/0170707 A1 Jul. 5, 2012

(30) Foreign Application Priority Data

Dec. 29, 2010 (TW) ............................... 99146586 A

(51) Int. Cl.
*G11C 19/00* (2006.01)
(52) U.S. Cl.
USPC .................... 377/64; 377/68; 377/78; 377/79
(58) Field of Classification Search
None
See application file for complete search history.

(56) References Cited

U.S. PATENT DOCUMENTS

| | | | | |
|---|---|---|---|---|
| 7,250,788 B2* | 7/2007 | Lee et al. | ......................... | 326/46 |
| 7,817,770 B2* | 10/2010 | Chang et al. | ..................... | 377/64 |
| 7,983,379 B2* | 7/2011 | Ieong et al. | ...................... | 377/64 |
| 8,031,160 B2* | 10/2011 | Chen et al. | ..................... | 345/100 |
| 8,284,149 B2* | 10/2012 | Yoon et al. | ..................... | 345/100 |
| 2004/0125069 A1 | 7/2004 | Park | | |
| 2004/0227718 A1 | 11/2004 | Park | | |
| 2008/0116944 A1* | 5/2008 | Tobita et al. | ................... | 327/142 |
| 2009/0058790 A1* | 3/2009 | Chiang et al. | ................. | 345/100 |
| 2010/0245300 A1* | 9/2010 | Chan et al. | ..................... | 345/204 |
| 2011/0116592 A1 | 5/2011 | Tsai | | |
| 2011/0142192 A1 | 6/2011 | Lin et al. | | |
| 2011/0274234 A1* | 11/2011 | Sakamoto et al. | ............... | 377/64 |
| 2012/0087460 A1* | 4/2012 | Moriwaki | ........................ | 377/64 |
| 2012/0213323 A1* | 8/2012 | Tsai | ............................... | 377/64 |
| 2012/0242630 A1* | 9/2012 | Ohara | ........................... | 345/204 |

FOREIGN PATENT DOCUMENTS

| | | |
|---|---|---|
| CN | 101377956 A | 3/2009 |
| CN | 101777386 A | 7/2010 |
| CN | 101866697 A | 10/2010 |

* cited by examiner

*Primary Examiner* — Tuan T Lam
(74) *Attorney, Agent, or Firm* — Winston Hsu; Scott Margo

(57) ABSTRACT

A shift register circuit includes plural shift register stages for providing plural gate signals. Each shift register stage includes an input unit and a pull-up unit. The pull-up unit is utilized for pulling up a gate signal according to a system clock and a driving control voltage. The input unit is employed for outputting the driving control voltage according to a control signal and an input signal. The input unit includes a switch device having a first transistor and a second transistor. The first transistor has a first end for receiving the input signal, a gate end for receiving the control signal, and a second end. The second transistor has a first end electrically connected to the second end of the first transistor, a gate end electrically connected to the first end of the first transistor, and a second end for outputting the driving control voltage.

12 Claims, 6 Drawing Sheets

SWITCH DEVICE AND SHIFT REGISTER CIRCUIT USING THE SAME

BACKGROUND

1. Technical Field

The disclosure relates to a switch device and a shift register circuit, and more particularly, to a switch device and a shift register circuit using the switch device for achieving low power consumption and high driving ability.

2. Related Art

Liquid crystal displays (LCDs) have advantages of a thin profile, low power consumption, and low radiation, and are broadly adopted for application in media players, mobile phones, personal digital assistants (PDAs), computer displays, and flat screen televisions. The operation of a liquid crystal display is featured by modulating the voltage drop across opposite sides of a liquid crystal layer for twisting the angles of liquid crystal molecules in the liquid crystal layer so that the transmittance of the liquid crystal layer can be controlled for illustrating images with the aid of light source provided by a backlight module. In general, the liquid crystal display comprises plural pixel units, a source driver, and a shift register circuit. The source driver is utilized for providing plural data signals to be written into the pixel units. The shift register circuit comprises a plurality of shift register stages and functions to generate plural gate signals for controlling the operations of writing the data signals into the pixel units. That is, the shift register circuit is a crucial device for providing a control of writing the data signals into the pixel units.

It is well known that traditional liquid crystal display includes lots of switch devices, and each switch device has at least one thin film transistor (TFT) disposed therein. Consequently, the reverse leakage currents of thin film transistors disposed in the traditional liquid crystal display have a significant effect to cause high power consumption and high panel working temperature, which degrades panel display quality and reduces panel lifetime. Besides, if the shift register circuit is integrated in a display panel comprising pixel array to bring the cost down, i.e. based on a gate-driver on array (GOA) architecture, the aforementioned shift register stages are sequentially arranged in a lengthy border area of the display panel so that each shift register stage can be directly connected to one corresponding gate line, and low signal transmitting ability caused by the turn-on resistance of each switch device may further degrade panel display quality.

These and other objectives of the present invention will no doubt become obvious to those of ordinary skill in the art after reading the following detailed description of the preferred embodiment that is illustrated in the various figures and drawings.

DETAILED DESCRIPTION

Hereinafter, preferred embodiments of the present invention will be described in detail with reference to the accompanying drawings. Here, it is to be noted that the present invention is not limited thereto.

Figure 1:
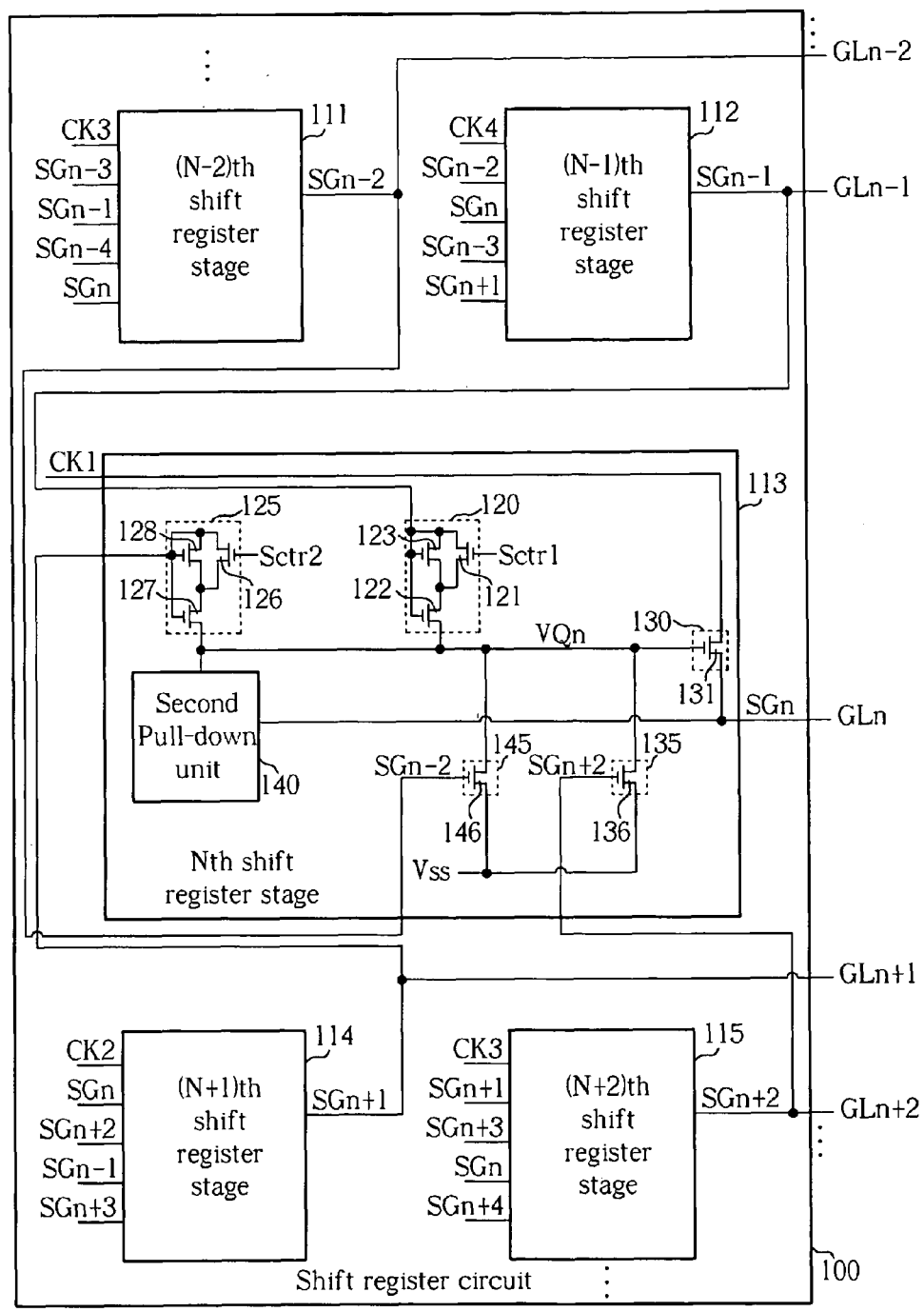
FIG. 1 is a schematic diagram showing a shift register circuit in accordance with a first embodiment of the present invention.

FIG. 1 is a schematic diagram showing a shift register circuit in accordance with a first embodiment of the present invention. As shown in FIG. 1, the shift register circuit 100 with bi-directional scan mechanism comprises a plurality of shift register stages and, for ease of explanation, illustrates an (N−2)th shift register stage 111, an (N−1)th shift register stage 112, an Nth shift register stage 113, an (N+1)th shift register stage 114 and an (N+2)th shift register stage 115. For the sake of brevity, only the internal structure of the Nth shift register stage 113 is exemplified in detail. The internal structures of other shift register stages are similar to the Nth shift register stage 113 and can be inferred by analogy. In the operation of the shift register circuit 100, the Nth shift register stage 113 is utilized for generating a gate signal SGn according to a gate signal SGn−1 generated by the (N−1)th shift register stage 112, a gate signal SGn+1 generated by the (N+1)th shift register stage 114, a gate signal SGn−2 generated by the (N−2)th shift register stage 111, a gate signal SGn+2 generated by the (N+2)th shift register stage 115, and a first system clock CK1. The circuit functions of other shift register stages are similar to the Nth shift register stage 113 and can be inferred by analogy. It is noted that the gate pulses of the first system clock CK1, a second system clock CK2, a third system clock CK3 and a fourth system clock CK4 shown in FIG. 1 may be sequentially and periodically staggered.

The Nth shift register stage 113 comprises a first input unit 120, a second input unit 125, a pull-up unit 130, a first pull-down unit 135, a second pull-down unit 140, and a third pull-down unit 145. The first input unit 120, electrically connected to the (N−1)th shift register stage 112, is utilized for outputting a driving control voltage VQn according to the gate signal SGn−1 and a first control signal Sctr1. The second input unit 125, electrically connected to the (N+1)th shift register stage 114, is utilized for outputting the driving control voltage VQn according to the gate signal SGn+1 and a second control signal Sctr2 having a phase opposite to the first control signal Sctr1.

The pull-up unit 130, electrically connected to the first input unit 120, the second input unit 125 and a gate line GLn, is utilized for pulling up the gate signal SGn according to the driving control voltage VQn and the first system clock CK1. The gate line GLn is employed to transmit the gate signal SGn. The first pull-down unit 135, electrically connected to the first input unit 120, the second input unit 125 and the (N+2)th shift register stage 115, is utilized for pulling down the driving control voltage VQn according to the gate signal SGn+2. The second pull-down unit 140, electrically connected to the first input unit 120, the second input unit 125 and the gate line GLn, is utilized for pulling down the gate signal SGn according to the driving control voltage VQn. The third pull-down unit 145, electrically connected to the first input unit 120, the second input unit 125 and the (N−2)th shift register stage 111, is utilized for pulling down the driving control voltage VQn according to the gate signal SGn−2.

In the embodiment shown in FIG. 1, the first input unit 120 comprises a first transistor 121, a second transistor 122 and a third transistor 123, the second input unit 125 comprises a fourth transistor 126, a fifth transistor 127 and a sixth transistor 128, the first pull-down unit 135 comprises a seventh transistor 136, the third pull-down unit 145 comprises an eighth transistor 146, and the pull-up unit 130 comprises a ninth transistor 131. It is noted that each of the transistors aforementioned or to be mentioned may be a thin film transistor (TFT), a field effect transistor (FET) or other similar device having connection/disconnection switching functionality.

The first transistor 121 comprises a first end electrically connected to the (N−1)th shift register stage 112 for receiving the gate signal SGn−1, a gate end for receiving the first control signal Sctr1, and a second end electrically connected to the second transistor 122. The second transistor 122 comprises a first end electrically connected to the second end of the first transistor 121, a gate end electrically connected to the first end of the first transistor 121, and a second end for outputting the driving control voltage VQn. The third transistor 123 comprises a first end electrically connected to the first end of the first transistor 121, a gate end electrically connected to the gate end of the second transistor 122, and a second end electrically connected to the second end of the first transistor 121. The combination of the first transistor 121, the second transistor 122 and the third transistor 123 is employed to form a first switch device for providing a control of connecting/disconnecting the first end of the first transistor 121 and the second end of the second transistor 122 according to the gate signal SGn−1 and the first control signal Sctr1. When the first switch device is turned on, i.e. in a connection state, the turn-on channel of the first transistor 121 is parallel with the turn-on channel of the third transistor 123, and therefore the turn-on resistance of the first switch device can be reduced, which in turn reduces the turn-on voltage drop across the first switch device for enhancing the driving ability thereof. When the first switch device is turned off, i.e. in a disconnection state, the serial-connected transistors of the first switch device, regarding the second transistor 122 together with either the first transistor 121 or the third transistor 123, can be employed to suppress the reverse leakage current of the first switch device for reducing power consumption.

The fourth transistor 126 comprises a first end electrically connected to the (N+1)th shift register stage 114 for receiving the gate signal SGn+1, a gate end for receiving the second control signal Sctr2, and a second end electrically connected to the fifth transistor 127. The fifth transistor 127 comprises a first end electrically connected to the second end of the fourth transistor 126, a gate end electrically connected to the first end of the fourth transistor 126, and a second end for outputting the driving control voltage VQn. The sixth transistor 128 comprises a first end electrically connected to the first end of the fourth transistor 126, a gate end electrically connected to the gate end of the fifth transistor 127, and a second end electrically connected to the second end of the fourth transistor 126. The combination of the fourth transistor 126, the fifth transistor 127 and the sixth transistor 128 is employed to form a second switch device for providing a control of connecting/disconnecting the first end of the fourth transistor 126 and the second end of the fifth transistor 127 according to the gate signal SGn+1 and the second control signal Sctr2. Likewise, the operation of the second switch device is also able to achieve high driving ability and low power consumption.

The seventh transistor 136 comprises a first end electrically connected to the second ends of the second transistor 122 and the fifth transistor 127, a gate end electrically connected to the (N+2)th shift register stage 115 for receiving the gate signal SGn+2, and a second end for receiving a power voltage Vss. The eighth transistor 146 comprises a first end electrically connected to the second ends of the second transistor 122 and the fifth transistor 127, a gate end electrically connected to the (N−2)th shift register stage 111 for receiving the gate signal SGn−2, and a second end for receiving the power voltage Vss. The ninth transistor 131 comprises a first end for receiving the first system clock CK1, a gate end electrically connected to the second ends of the second transistor 122 and the fifth transistor 127, and a second end electrically connected to the gate line GLn.

Figure 2:
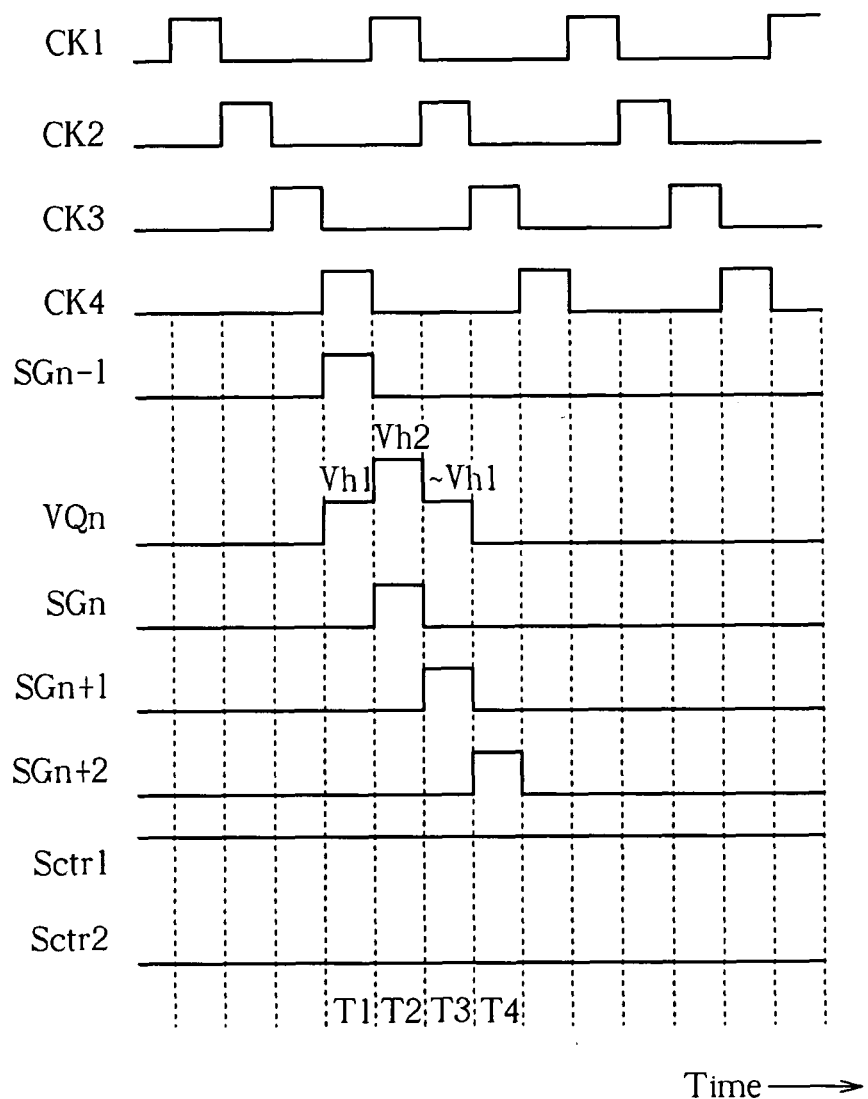
FIG. 2 is a schematic diagram showing related signal waveforms regarding the forward gate-signal scanning operation of the shift register circuit illustrated in FIG. 1, having time along the abscissa.

FIG. 2 is a schematic diagram showing related signal waveforms regarding the forward gate-signal scanning operation of the shift register circuit 100 illustrated in FIG. 1, having time along the abscissa. The signal waveforms in FIG. 2, from top to bottom, are the first system clock CK1, the second system clock CK2, the third system clock CK3, the fourth system clock CK4, the gate signal SGn−1, the driving control voltage VQn, the gate signal SGn, the gate signal SGn+1, the gate signal SGn+2, the first control signal Sctr1, and the second control signal Sctr2. As shown in FIG. 2, in the forward gate-signal scanning operation of the shift register circuit 100, the first control signal Sctr1 is at a first voltage level for turning on the first transistor 121, and the second control signal Sctr2 is at a second voltage level for turning off the fourth transistor 126.

Referring to FIG. 2 in conjunction with FIG. 1, during an interval T1, the second transistor 122 and the third transistor 123 are turned on by the gate signal SGn−1 having high level voltage, and the first transistor 121 has already been turned on by the first control signal Sctr1 at the first voltage level as aforementioned, such that the driving control voltage VQn can be quickly pulled up to a first high voltage Vh1. During an interval T2, the driving control voltage VQn is pulled up to a second high voltage Vh2 by the rising edge of the first system clock CK1 through coupling of the device capacitor of the ninth transistor 131, and the ninth transistor 131 is then turned on for pulling up the gate signal SGn to the high level voltage of the first system clock CK1. It is noted that the second high voltage Vh2 approximates twice the high level voltage of the first system clock CK1. During an interval T3, the driving control voltage VQn is pulled down to approximate the first high voltage Vh1 by the falling edge of the first system clock CK1 through coupling of the device capacitor of the ninth transistor 131. Alternatively, the driving control voltage VQn may be set to approximate the first high voltage Vh1 by the gate signal SGn+1 having high level voltage which turns on the fifth transistor 127 and the sixth transistor 128 of the second input unit 125. At this time, the ninth transistor 131 is still turned on by the driving control voltage VQn so that the gate signal SGn can be pulled down to the low level voltage of the first system clock CK1. During an interval T4, the seventh transistor 136 is turned on by the gate signal SGn+2 having high level voltage, and the driving control voltage VQn is then pulled down to the power voltage Vss.

According to the above description regarding the forward gate-signal scanning operation of the shift register circuit 100, when the first switch device, i.e. the combination of the first through third transistors 121-123, is turned on during the interval T1, the turn-on channel of the first transistor 121 is parallel with the turn-on channel of the third transistor 123 for reducing the turn-on resistance of the first switch device, such that the driving control voltage VQn can be quickly pulled up to the first high voltage Vh1 which is higher than a corresponding high voltage pulled up according to the prior art. When the first switch device is turned off during the intervals T2 and T3, although the voltage drop of the second high voltage Vh2 or the first high voltage Vh1 is applied to the opposite ends of the first switch device, the reverse leakage current of the first switch device can be suppressed by the serial-connected transistors of the first switch device, thereby reducing power consumption. The backward gate-signal scanning operation of the shift register circuit 100 is similar to the aforementioned forward gate-signal scanning operation and can be inferred by analogy.

Figure 3:
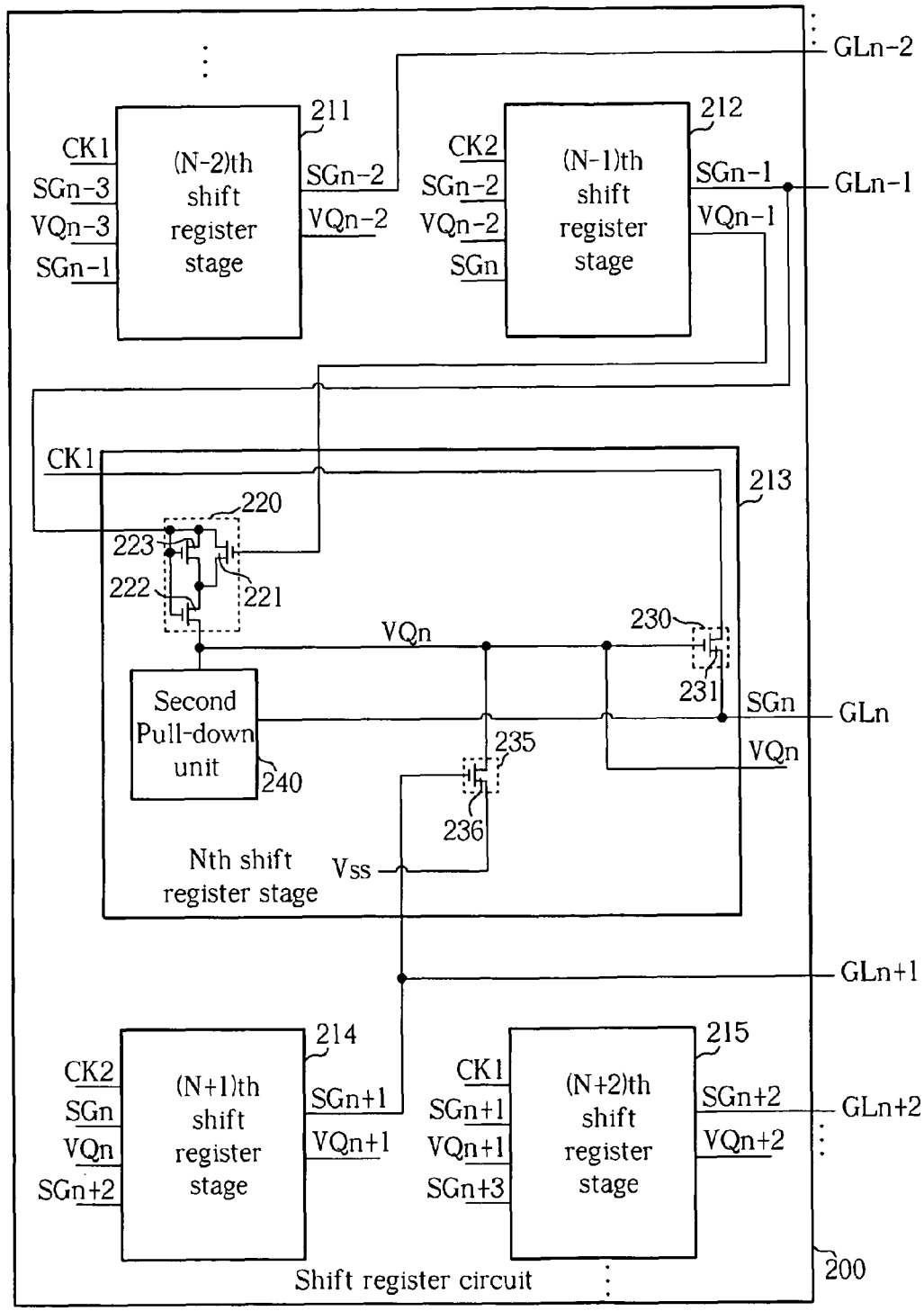
FIG. 3 is a schematic diagram showing a shift register circuit in accordance with a second embodiment of the present invention.

FIG. 3 is a schematic diagram showing a shift register circuit in accordance with a second embodiment of the present invention. As shown in FIG. 3, the shift register circuit 200 with single-directional scan mechanism comprises a plurality of shift register stages and, for ease of explanation, illustrates an (N−2)th shift register stage 211, an (N−1)th shift register stage 212, an Nth shift register stage 213, an (N+1)th shift register stage 214 and an (N+2)th shift register stage 215. For the sake of brevity, only the internal structure of the Nth shift register stage 213 is exemplified in detail. The internal structures of other Shift register stages are similar to the Nth shift register stage 213 and can be inferred by analogy. In the operation of the shift register circuit 200, the Nth shift register stage 213 is utilized for generating a gate signal SGn and a driving control voltage VQn according to a gate signal SGn−1 generated by the (N−1)th shift register stage 212, a driving control voltage VQn−1 generated by the (N−1)th shift register stage 212, a gate signal SGn+1 generated by the (N+1)th shift register stage 214, and a first system clock CK1. The circuit functions of other shift register stages are similar to the Nth shift register stage 213 and can be inferred by analogy. It is noted that a second system clock CK2 shown in FIG. 3 has a phase opposite to the first system clock CK1.

The Nth shift register stage 213 comprises an input unit 220, a pull-up unit 230, a first pull-down unit 235, and a second pull-down unit 240. The input unit 220, electrically connected to the (N−1)th shift register stage 212, is utilized for outputting the driving control voltage VQn according to the gate signal SGn−1 and the driving control voltage VQn−1. The pull-up unit 230, electrically connected to the input unit 220 and a gate line GLn, is utilized for pulling up the gate signal SGn according to the driving control voltage VQn and the first system clock CK1. The gate line GLn is employed to transmit the gate signal SGn. The first pull-down unit 235, electrically connected to the input unit 220 and the (N+1)th shift register stage 214, is utilized for pulling down the driving control voltage VQn according to the gate signal SGn+1. The second pull-down unit 240, electrically connected to the input unit 220 and the gate line GLn, is utilized for pulling down the gate signal SGn according to the driving control voltage VQn. In the embodiment shown in FIG. 3, the input unit 220 comprises a first transistor 221, a second transistor 222 and a third transistor 223, the first pull-down unit 235 comprises a seventh transistor 236, and the pull-up unit 230 comprises a ninth transistor 231.

The first transistor 221 comprises a first end electrically connected to the (N−1)th shift register stage 212 for receiving the gate signal SGn−1, a gate end electrically connected to the (N−1)th shift register stage 212 for receiving the driving control voltage VQn−1, and a second end electrically connected to the second transistor 222. In another embodiment, the gate end of the first transistor 221 is electrically connected to the (N−1)th shift register stage 212 for receiving the gate signal SGn−1. The second transistor 222 comprises a first end electrically connected to the second end of the first transistor 221, a gate end electrically connected to the first end of the first transistor 221, and a second end for outputting the driving control voltage VQn. The third transistor 223 comprises a first end electrically connected to the first end of the first transistor 221, a gate end electrically connected to the gate end of the second transistor 222, and a second end electrically connected to the second end of the first transistor 221.

The combination of the first transistor 221, the second transistor 222 and the third transistor 223 is employed to form a switch device for providing a control of connecting/disconnecting the first end of the first transistor 221 and the second end of the second transistor 222 according to the gate signal SGn−1 and the driving control voltage VQn−1. When the switch device is turned on, the turn-on channel of the first transistor 221 is parallel with the turn-on channel of the third transistor 223, and therefore the turn-on resistance of the switch device can be reduced, which in turn reduces the turn-on voltage drop across the switch device for enhancing the driving ability thereof. When the switch device is turned off, the serial-connected transistors of the switch device can be employed to suppress the reverse leakage current of the switch device for reducing power consumption. Besides, when the second transistor 222 and the third transistor 223 are turned on by the gate signal SGn−1 having high level voltage, the first transistor 221 is turned on by the driving control voltage VQn−1 which approximates twice the high level voltage of the second system clock CK2 for significantly reducing the turn-on resistance of the first transistor 221, thereby further reducing the turn-on voltage drop across the switch device for enhancing the driving ability thereof.

The seventh transistor 236 comprises a first end electrically connected to the second end of the second transistor 222, a gate end electrically connected to the (N+1)th shift register stage 214 for receiving the gate signal SGn+1, and a second end for receiving a power voltage Vss. The ninth transistor 231 comprises a first end for receiving the first system clock CK1, a gate end electrically connected to the second end of the second transistor 222, and a second end electrically connected to the gate line GLn. The gate-signal scanning operation of the shift register circuit 200 is similar to the aforementioned forward gate-signal scanning operation of the shift register circuit 100 and can be inferred by analogy.

Figure 4:
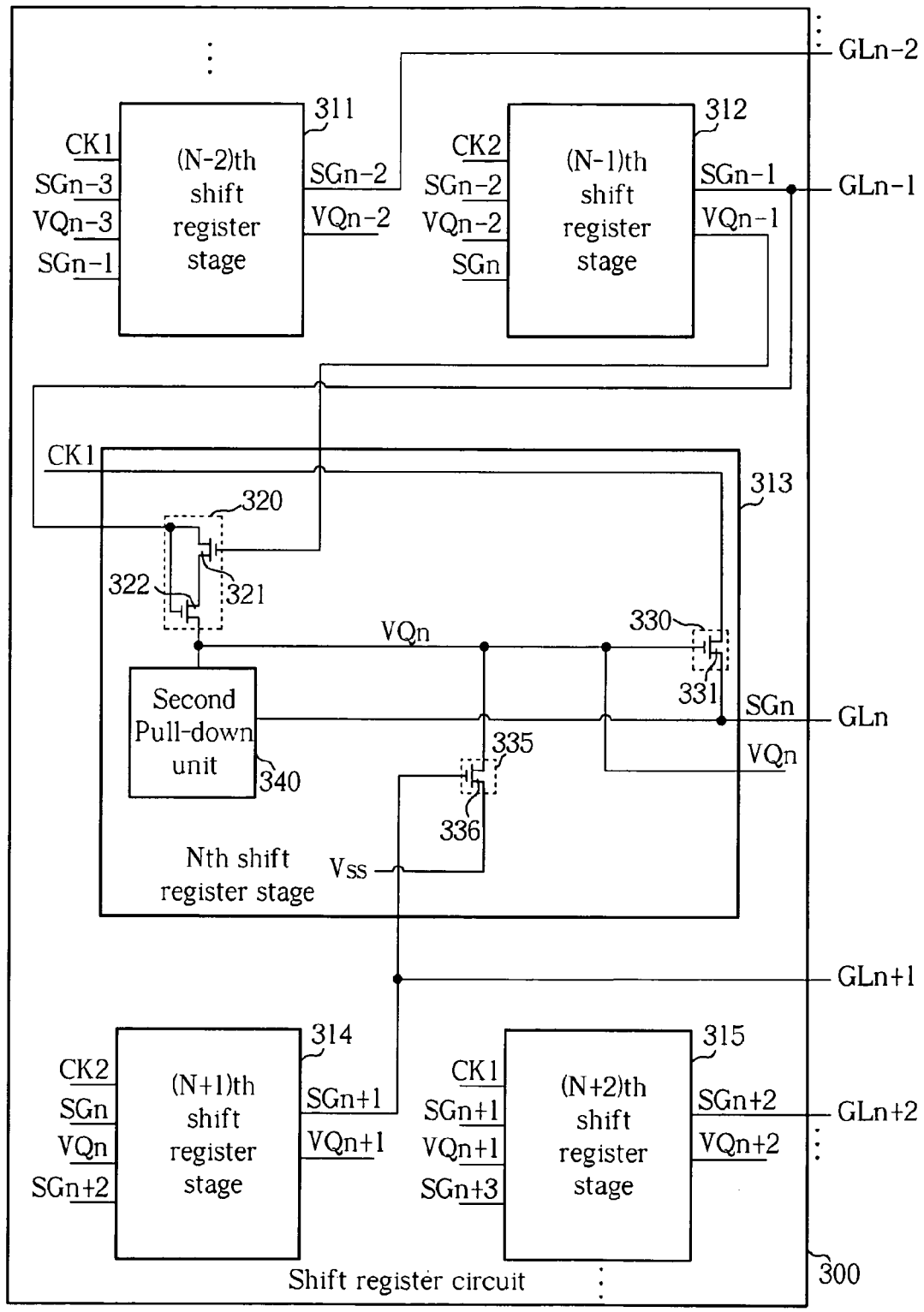
FIG. 4 is a schematic diagram showing a shift register circuit in accordance with a third embodiment of the present invention.

FIG. 4 is a schematic diagram showing a shift register circuit in accordance with a third embodiment of the present invention. As shown in FIG. 4, the shift register circuit 300 with single-directional scan mechanism comprises a plurality of shift register stages and, for ease of explanation, illustrates an (N−2)th shift register stage 311, an (N−1)th shift register stage 312, an Nth shift register stage 313, an (N+1)th shift register stage 314 and an (N+2)th shift register stage 315. For the sake of brevity, only the internal structure of the Nth shift register stage 313 is exemplified in detail. The internal structures of other shift register stages are similar to the Nth shift register stage 313 and can be inferred by analogy. In the operation of the shift register circuit 300, the Nth shift register stage 313 is utilized for generating a gate signal SGn and a driving control voltage VQn according to a gate signal SGn−1 generated by the (N−1)th shift register stage 312, a driving control voltage VQn−1 generated by the (N−1)th shift register stage 312, a gate signal SGn+1 generated by the (N+1)th shift register stage 314, and a first system clock CK1. The circuit functions of other shift register stages are similar to the Nth shift register stage 313 and can be inferred by analogy. It is noted that a second system clock CK2 shown in FIG. 4 has a phase opposite to the first system clock CK1.

The Nth shift register stage 313 comprises an input unit 320, a pull-up unit 330, a first pull-down unit 335, and a second pull-down unit 340. The input unit 320, electrically connected to the (N−1)th shift register stage 312, is utilized for outputting the driving control voltage VQn according to the gate signal SGn−1 and the driving control voltage VQn−1. The pull-up unit 330, electrically connected to the input unit 320 and a gate line GLn, is utilized for pulling up the gate signal SGn according to the driving control voltage VQn and the first system clock CK1. The gate line GLn is employed to transmit the gate signal SGn. The first pull-down unit 335, electrically connected to the input unit 320 and the (N+1)th shift register stage 314, is utilized for pulling down the driving control voltage VQn according to the gate signal SGn+1. The second pull-down unit 340, electrically connected to the input unit 320 and the gate line GLn, is utilized for pulling down the gate signal SGn according to the driving control voltage VQn. In the embodiment shown in FIG. 4, the input unit 320 comprises a first transistor 321 and a second transistor 322, the first pull-down unit 335 comprises a seventh transistor 336, and the pull-up unit 330 comprises a ninth transistor 331.

The first transistor 321 comprises a first end electrically connected to the (N−1)th shift register stage 312 for receiving the gate signal SGn−1, a gate end electrically connected to the (N−1)th shift register stage 312 for receiving the driving control voltage VQn−1, and a second end electrically connected to the second transistor 322. In another embodiment, the gate end of the first transistor 321 is electrically connected to the (N−1)th shift register stage 312 for receiving the gate signal SGn−1. The second transistor 322 comprises a first end electrically connected to the second end of the first transistor 321, a gate end electrically connected to the first end of the first transistor 321, and a second end for outputting the driving control voltage VQn.

The combination of the first transistor 321 and the second transistor 322 is employed to form a switch device for providing a control of connecting/disconnecting the first end of the first transistor 321 and the second end of the second transistor 322 according to the gate signal SGn−1 and the driving control voltage VQn−1. When the switch device is turned on, the second transistor 322 is turned on by the gate signal SGn−1 having high level voltage, and the first transistor 321 is turned on by the driving control voltage VQn−1 which approximates twice the high level voltage of the second system clock CK2 for significantly reducing the turn-on resistance of the first transistor 321, thereby reducing the turn-on voltage drop across the switch device for enhancing the driving ability thereof. When the switch device is turned off, the serial-connected transistors of the switch device can be employed to suppress the reverse leakage current of the switch device for reducing power consumption.

The seventh transistor 336 comprises a first end electrically connected to the second end of the second transistor 322, a gate end electrically connected to the (N+1)th shift register stage 314 for receiving the gate signal SGn+1, and a second end for receiving a power voltage Vss. The ninth transistor 331 comprises a first end for receiving the first system clock CK1, a gate end electrically connected to the second end of the second transistor 322, and a second end electrically connected to the gate line GLn. The gate-signal scanning operation of the shift register circuit 300 is similar to the aforementioned forward gate-signal scanning operation of the shift register circuit 100 and can be inferred by analogy.

Figure 5:
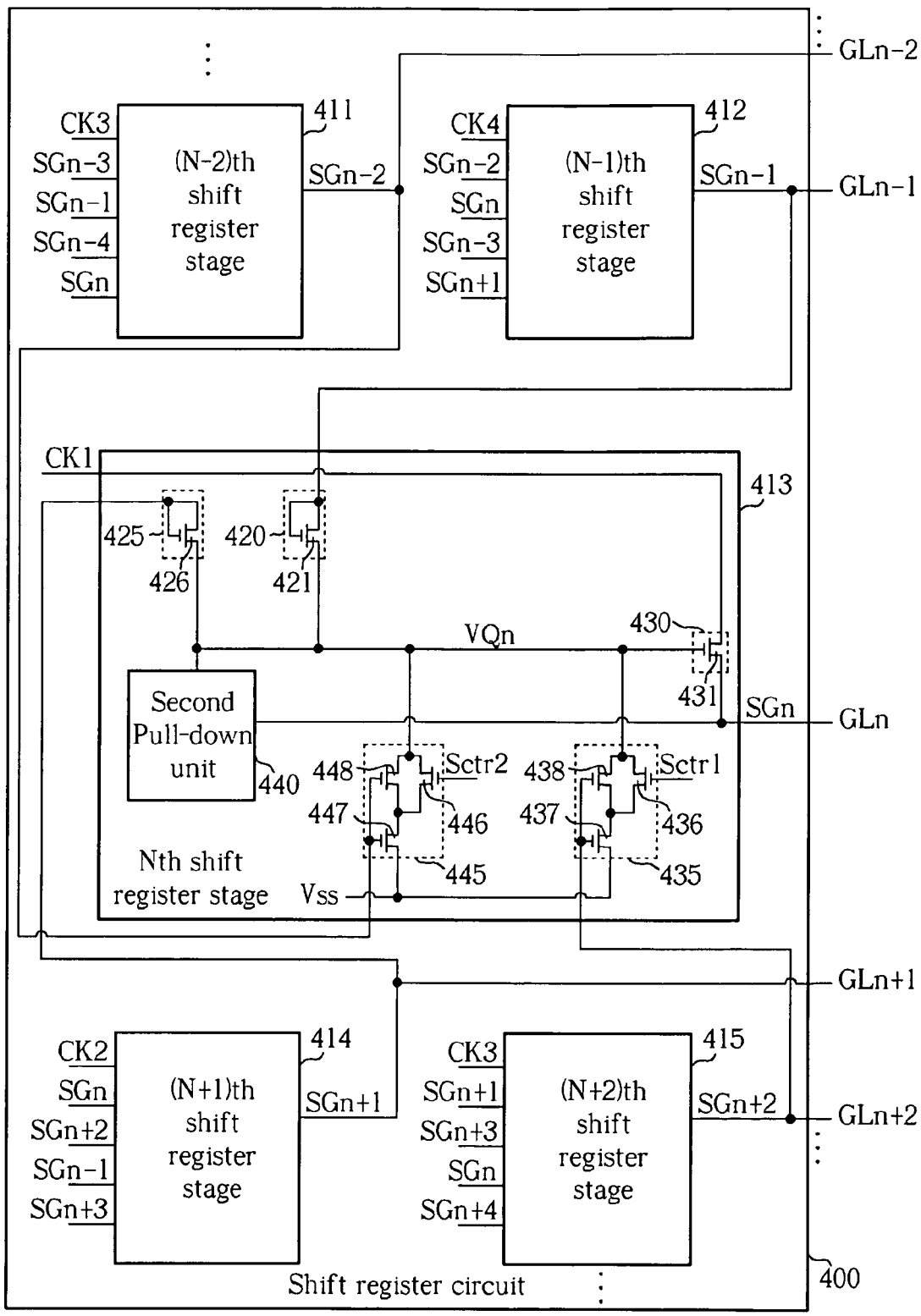
FIG. 5 is a schematic diagram showing a shift register circuit in accordance with a fourth embodiment of the present invention.

FIG. 5 is a schematic diagram showing a shift register circuit in accordance with a fourth embodiment of the present invention. As shown in FIG. 5, the shift register circuit 400 with bi-directional scan mechanism comprises a plurality of shift register stages and, for ease of explanation, illustrates an (N−2)th shift register stage 411, an (N−1)th shift register stage 412, an Nth shift register stage 413, an (N+1)th shift register stage 414 and an (N+2)th shift register stage 415. For the sake of brevity, only the internal structure of the Nth shift register stage 413 is exemplified in detail. The internal structures of other shift register stages are similar to the Nth shift register stage 413 and can be inferred by analogy. In the operation of the shift register circuit 400, the Nth shift register stage 413 is utilized for generating a gate signal SGn according to a gate signal SGn−1 generated by the (N−1)th shift register stage 412, a gate signal SGn+1 generated by the (N+1)th shift register stage 414, a gate signal SGn−2 generated by the (N−2)th shift register stage 411, a gate signal SGn+2 generated by the (N+2)th shift register stage 415, and a first system clock CK1. The circuit functions of other shift register stages are similar to the Nth shift register stage 413 and can be inferred by analogy. It is noted that the gate pulses of the first system clock CK1, a second system clock CK2, a third system clock CK3 and a fourth system clock CK4 shown in FIG. 5 may be sequentially and periodically staggered.

The Nth shift register stage 413 comprises a first input unit 420, a second input unit 425, a pull-up unit 430, a first pull-down unit 435, a second pull-down unit 440, and a third pull-down unit 445. The first input unit 420, electrically connected to the (N−1)th shift register stage 412, is utilized for outputting a driving control voltage VQn according to the gate signal SGn−1. The second input unit 425, electrically connected to the (N+1)th shift register stage 414, is utilized for outputting the driving control voltage VQn according to the gate signal SGn+1. The pull-up unit 430, electrically connected to the first input unit 420, the second input unit 425 and a gate line GLn, is utilized for pulling up the gate signal SGn according to the driving control voltage VQn and the first system clock CK1. The gate line GLn is employed to transmit the gate signal SGn.

The first pull-down unit 435, electrically connected to the first input unit 420, the second input unit 425 and the (N+2)th shift register stage 415, is utilized for pulling down the driving control voltage VQn according to the gate signal SGn+2 and a first control signal Sctr1. The second pull-down unit 440, electrically connected to the first input unit 420, the second input unit 425 and the gate line GLn, is utilized for pulling down the gate signal SGn according to the driving control voltage VQn. The third pull-down unit 445, electrically connected to the first input unit 420, the second input unit 425 and the (N−2)th shift register stage 411, is utilized for pulling down the driving control voltage VQn according to the gate signal SGn−2 and a second control signal Sctr2 having a phase opposite to the first control signal Sctr1.

In the embodiment shown in FIG. 5, the first pull-down unit 435 comprises a first transistor 436, a second transistor 437 and a third transistor 438, the third pull-down unit 445 comprises a fourth transistor 446, a fifth transistor 447 and a sixth transistor 448, the first input unit 420 comprises a seventh transistor 421, the second input unit 425 comprises an eighth transistor 426, and the pull-up unit 430 comprises a ninth transistor 431. The seventh transistor 421 comprises a first end electrically connected to the (N−1)th shift register stage 412 for receiving the gate signal SGn−1, a gate end electrically connected to the (N−1)th shift register stage 412 for receiving the gate signal SGn−1, and a second end for outputting the driving control voltage VQn. The eighth transistor 426 comprises a first end electrically connected to the (N+1)th shift register stage 414 for receiving the gate signal SGn+1, a gate end electrically connected to the (N+1)th shift register stage 414 for receiving the gate signal SGn+1, and a second end for outputting the driving control voltage VQn. The ninth transistor 431 comprises a first end for receiving the first system clock CK1, a gate end electrically connected to the second ends of the seventh transistor 421 and the eighth transistor 426, and a second end electrically connected to the gate line GLn.

The first transistor 436 comprises a first end electrically connected to the second ends of the seventh transistor 421 and the eighth transistor 426, a gate end for receiving the first control signal Sctr1, and a second end electrically connected to the second transistor 437. The second transistor 437 comprises a first end electrically connected to the second end of the first transistor 436, a gate end electrically connected to the (N+2)th shift register stage 415 for receiving the gate signal SGn+2, and a second end for receiving a power voltage Vss. The third transistor 438 comprises a first end electrically connected to the first end of the first transistor 436, a gate end electrically connected to the gate end of the second transistor 437, and a second end electrically connected to the second end of the first transistor 436. The combination of the first transistor 436, the second transistor 437 and the third transistor 438 is employed to form a first switch device for providing a control of connecting/disconnecting the first end of the first transistor 436 and the second end of the second transistor 437 according to the gate signal SGn+2 and the first control signal Sctr1. When the first switch device is turned on, the turn-on channel of the first transistor 436 is parallel with the turn-on channel of the third transistor 438, and therefore the turn-on resistance of the first switch device can be reduced, which in turn reduces the turn-on voltage drop across the first switch device for enhancing the driving ability thereof. When the first switch device is turned off, the serial-connected transistors of the first switch device can be employed to suppress the reverse leakage current of the first switch device for reducing power consumption.

The fourth transistor 446 comprises a first end electrically connected to the second ends of the seventh transistor 421 and the eighth transistor 426, a gate end for receiving the second control signal Sctr2, and a second end electrically connected to the fifth transistor 447. The fifth transistor 447 comprises a first end electrically connected to the second end of the fourth transistor 446, a gate end electrically connected to the (N−2)th shift register stage 411 for receiving the gate signal SGn−2, and a second end for receiving the power voltage Vss. The sixth transistor 448 comprises a first end electrically connected to the first end of the fourth transistor 446, a gate end electrically connected to the gate end of the fifth transistor 447, and a second end electrically connected to the second end of the fourth transistor 446. The combination of the fourth transistor 446, the fifth transistor 447 and the sixth transistor 448 is employed to form a second switch device for providing a control of connecting/disconnecting the first end of the fourth transistor 446 and the second end of the fifth transistor 447 according to the gate signal SGn−2 and the second control signal Sctr2. Likewise, the operation of the second switch device is also able to achieve high driving ability and low power consumption.

In the forward gate-signal scanning operation of the shift register circuit 400, the driving control voltage VQn can be quickly pulled down to the power voltage Vss by turning on the first switch device of the first pull-down unit 435. And after turning off the first switch device, the serial-connected transistors of the first switch device is employed to suppress the leakage current thereof for reducing power consumption. In the backward gate-signal scanning operation of the shift register circuit 400, the driving control voltage VQn can be quickly pulled down to the power voltage Vss by turning on the second switch device of the third pull-down unit 445. And after turning off the second switch device, the serial-connected transistors of the second switch device is employed to suppress the leakage current thereof for reducing power consumption. Other circuit functions regarding the forward/backward gate-signal scanning operation of the shift register circuit 400 are similar to the aforementioned forward gate-signal scanning operation of the shift register circuit 100 and can be inferred by analogy.

Figure 6:
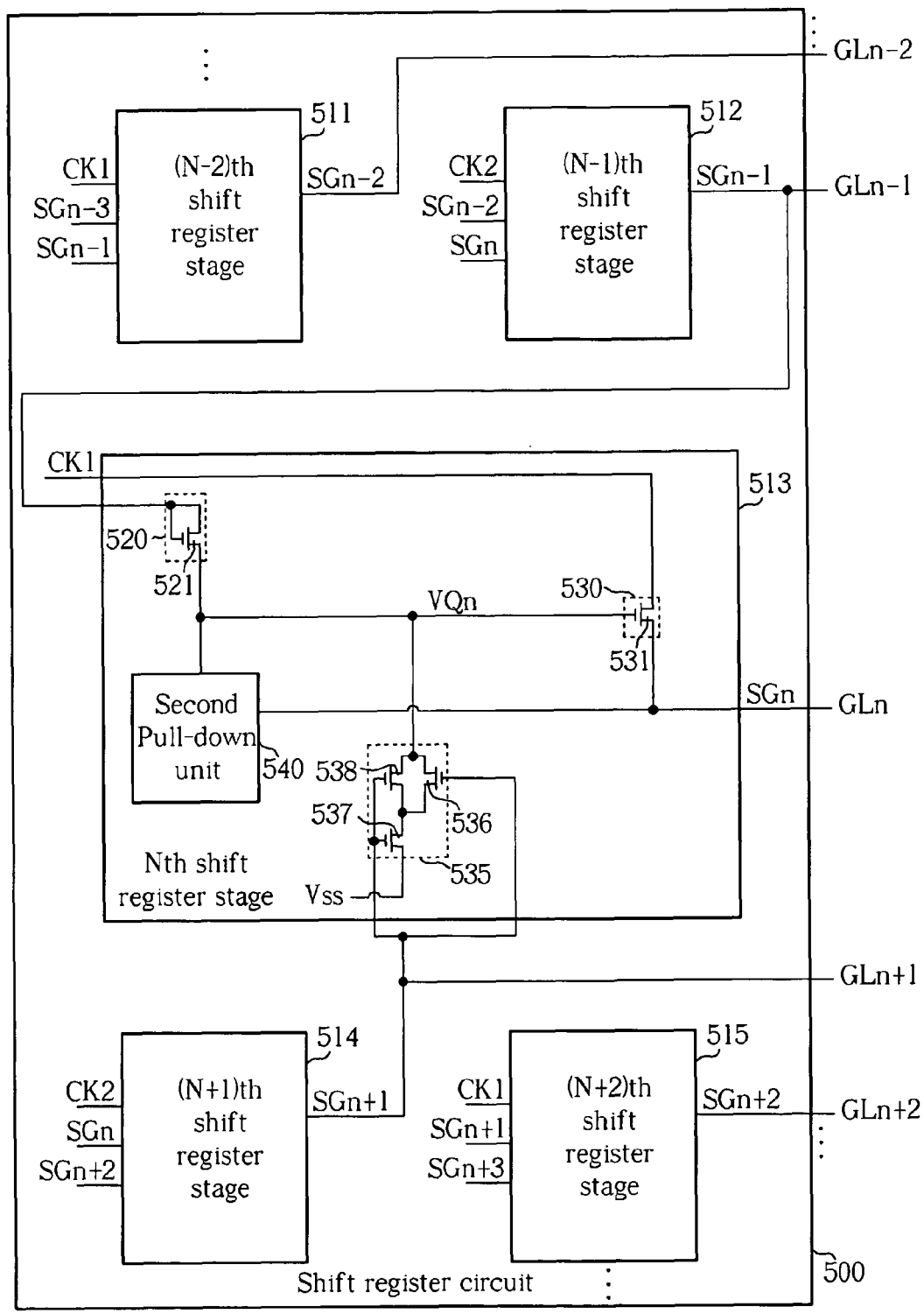
FIG. 6 is a schematic diagram showing a shift register circuit in accordance with a fifth embodiment of the present invention.

FIG. 6 is a schematic diagram showing a shift register circuit in accordance with a fifth embodiment of the present invention. As shown in FIG. 6, the shift register circuit 500 with single-directional scan mechanism comprises a plurality of shift register stages and, for ease of explanation, illustrates an (N−2)th shift register stage 511, an (N−1)th shift register stage 512, an Nth shift register stage 513, an (N+1)th shift register stage 514 and an (N+2)th shift register stage 515. For the sake of brevity, only the internal structure of the Nth shift register stage 513 is exemplified in detail. The internal structures of other shift register stages are similar to the Nth shift register stage 513 and can be inferred by analogy. In the operation of the shift register circuit 500, the Nth shift register stage 513 is utilized for generating a gate signal SGn according to a gate signal SGn−1 generated by the (N−1)th shift register stage 512, a gate signal SGn+1 generated by the (N+1)th shift register stage 514, and a first system clock CK1. The circuit functions of other shift register stages are similar to the Nth shift register stage 513 and can be inferred by analogy. It is noted that a second system clock CK2 shown in FIG. 6 has a phase opposite to the first system clock CK1.

The Nth shift register stage 513 comprises an input unit 520, a pull-up unit 530, a first pull-down unit 535, and a second pull-down unit 540. The input unit 520, electrically connected to the (N−1)th shift register stage 512, is utilized for outputting the driving control voltage VQn according to the gate signal SGn−1. The pull-up unit 530, electrically connected to the input unit 520 and a gate line GLn, is utilized for pulling up the gate signal SGn according to the driving control voltage VQn and the first system clock CK1. The gate line GLn is employed to transmit the gate signal SGn. The first pull-down unit 535, electrically connected to the input unit 520 and the (N+1)th shift register stage 514, is utilized for pulling down the driving control voltage VQn according to the gate signal SGn+1. The second pull-down unit 540, electrically connected to the input unit 520 and the gate line GLn, is utilized for pulling down the gate signal SGn according to the driving control voltage VQn. In the embodiment shown in FIG. 6, the first pull-down unit 535 comprises a first transistor 536, a second transistor 537 and a third transistor 538, the input unit 520 comprises a seventh transistor 521, and the pull-up unit 530 comprises a ninth transistor 531. The seventh transistor 521 comprises a first end electrically connected to the (N−1)th shift register stage 512 for receiving the gate signal SGn−1, a gate end electrically connected to the (N−1)th shift register stage 512 for receiving the gate signal SGn−1, and a second end for outputting the driving control voltage VQn. The ninth transistor 531 comprises a first end for receiving the first system clock CK1, a gate end electrically connected to the second end of the seventh transistor 521, and a second end electrically connected to the gate line GLn.

The first transistor 536 comprises a first end electrically connected to the second end of the seventh transistor 521, a gate end electrically connected to the (N+1)th shift register stage 514 for receiving the gate signal SGn+1, and a second end electrically connected to the second transistor 537. The second transistor 537 comprises a first end electrically connected to the second end of the first transistor 536, a gate end electrically connected to the (N+1)th shift register stage 514 for receiving the gate signal SGn+1, and a second end for receiving a power voltage Vss. The third transistor 538 comprises a first end electrically connected to the first end of the first transistor 536, a gate end electrically connected to the gate end of the second transistor 537, and a second end electrically connected to the second end of the first transistor 536.

The combination of the first transistor 536, the second transistor 537 and the third transistor 538 is employed to form a switch device for providing a control of connecting/disconnecting the first end of the first transistor 536 and the second end of the second transistor 537 according to the gate signal SGn+1. When the switch device is turned on, the turn-on channel of the first transistor 536 is parallel with the turn-on channel of the third transistor 538, and therefore the turn-on resistance of the switch device can be reduced, which in turn reduces the turn-on voltage drop across the switch device so as to enhance the driving ability thereof for quickly pulling down the driving control voltage VQn to the power voltage Vss. When the switch device is turned off, the serial-connected transistors of the switch device can be employed to suppress the reverse leakage current of the switch device for reducing power consumption. Other circuit functions regarding the gate-signal scanning operation of the shift register circuit 500 is similar to the aforementioned forward gate-signal scanning operation of the shift register circuit 100 and can be inferred by analogy.

It is noted that the circuit structures regarding the switch devices of the first pull-down unit 435 and the third pull-down unit 445 shown in FIG. 5 may be applied to the first pull-down unit 135 and the third pull-down unit 145 shown in FIG. 1, and the circuit structure regarding the switch device of the first pull-down unit 535 shown in FIG. 6 may be applied to the first pull-down unit 235 shown in FIG. 3 and the first pull-down unit 335 shown in FIG. 4.

According to the above description, in the operation of the shift register circuit according to the present invention, the switch device with the aforementioned two-transistor or three-transistor structure, for used in the input unit or the pull-down unit, is employed not only to provide high turn-on driving ability but also to suppress turn-off leakage current, thereby enhancing panel display quality and lowering power consumption. Besides, if the shift register circuit of the present invention is integrated in a display panel comprising pixel array to bring the cost down, i.e. based on a GOA architecture, high signal transmitting ability can be achieved for further improving display quality according to the high driving ability, and extended panel lifetime can be achieved due to low panel working temperature following the lower power consumption.

The present invention is by no means limited to the embodiments as described above by referring to the accompanying drawings, which may be modified and altered in a variety of different ways without departing from the scope of the present invention. Thus, it should be understood by those skilled in the art that various modifications, combinations, sub-combinations and alternations might occur depending on design requirements and other factors insofar as they are within the scope of the appended claims or the equivalents thereof.

What is claimed is:

1. A shift register circuit for providing plural gate signals to plural gate lines, the shift register circuit comprising a plurality of shift register stages, an Nth shift register stage of the shift register stages comprising:

a pull-up unit, electrically connected to an Nth gate line of the gate lines, for pulling up an Nth gate signal of the gate signals according to a system clock and an Nth driving control voltage, wherein the Nth gate line is employed to transmit the Nth gate signal;

a first input unit, electrically connected to the pull-up unit, for outputting the Nth driving control voltage according to an (N−1)th driving control signal and an (N−1)th gate signal of the gate signals, the first input unit comprising:
   a first transistor having a first end electrically connected to an (N−1)th shift register stage of the shift register stages for receiving the (N−1)th gate signal, a gate end electrically connected to the (N−1)th shift register stage for receiving the (N−1)th driving control signal, and a second end; and
   a second transistor having a first end electrically connected to the second end of the first transistor, a gate end electrically connected to the first end of the first transistor, and a second end for outputting the Nth driving control voltage;
   wherein the first end of the first transistor is electrically connected to an (N−1)th shift register stage of the shift register stages for receiving an (N−1)th gate signal of the gate signals, and the gate end of the first transistor is electrically connected to the (N−1)th shift register stage for receiving an (N−1)th driving control voltage, and a high voltage level of the (N−1)th driving control voltage is higher than a high voltage level of an (N−1)th gate signal.

2. The shift register circuit of claim 1, wherein the first input unit further comprises:
   a third transistor having a first end electrically connected to the first end of the first transistor, a gate end electrically connected to the gate end of the second transistor, and a second end electrically connected to the second end of the first transistor.

3. The shift register circuit of claim 1, further comprising:
   a second input unit, electrically connected to the pull-up unit, for outputting the Nth driving control voltage according to a second input signal and a second control signal having a phase opposite to the (N−1)th driving control signal, the second input unit comprising:
      a fourth transistor having a first end for receiving the second input signal, a gate end for receiving the second control signal, and a second end;
      a fifth transistor having a first end electrically connected to the second end of the fourth transistor, a gate end electrically connected to the first end of the fourth transistor, and a second end for outputting the Nth driving control voltage; and
      a sixth transistor having a first end electrically connected to the first end of the fourth transistor, a gate end electrically connected to the gate end of the fifth transistor, and a second end electrically connected to the second end of the fourth transistor.

4. The shift register circuit of claim 3, wherein the first end of the fourth transistor is electrically connected to an (N+1)th shift register stage of the shift register stages for receiving an (N+1)th gate signal of the gate signals.

5. The shift register circuit of claim 3, further comprising:
   a first pull-down unit, electrically connected to the first input unit and the second input unit, for pulling down the Nth driving control voltage according to a third input signal;
   a second pull-down unit, electrically connected to the first input unit, the second input unit and the Nth gate line, for pulling down the Nth gate signal according to the Nth driving control voltage; and a third pull-down unit, electrically connected to the first input unit and the second input unit, for pulling down the Nth driving control voltage according to a fourth input signal.

6. The shift register circuit of claim 5, wherein:

the first end of the fourth transistor is electrically connected to an (N+1)th shift register stage of the shift register stages for receiving an (N+1)th gate signal of the gate signals;

the first pull-down unit comprises a seventh transistor having a first end electrically connected to the first and second input units, a gate end connected to an (N+2)th shift register stage of the shift register stages for receiving an (N+2)th gate signal of the gate signals, and a second end for receiving a power voltage;

the third pull-down unit comprises an eighth transistor having a first end electrically connected to the first and second input units, a gate end connected to an (N−2)th shift register stage of the shift register stages for receiving an (N−2)th gate signal of the gate signals, and a second end for receiving the power voltage; and the pull-up unit comprises a ninth transistor having a first end for receiving the system clock, a second end electrically connected to the Nth gate line, and a gate end for receiving the Nth driving control voltage.

7. The shift register circuit of claim 1, further comprising:

a first pull-down unit, electrically connected to the first input unit, for pulling down the Nth driving control voltage according to an (N+1)th gate signal of the gate signals which is generated by an (N+1)th shift register stage of the shift register stages; and a second pull-down unit, electrically connected to the first input unit and the Nth gate line, for pulling down the Nth gate signal according to the Nth driving control voltage.

8. A shift register circuit for providing plural gate signals to plural gate lines, the shift register circuit comprising a plurality of shift register stages, an Nth shift register stage of the shift register stages comprising:

a pull-up unit, electrically connected to an Nth gate line of the gate lines, for pulling up an Nth gate signal of the gate signals according to a system clock and an Nth driving control voltage, wherein the Nth gate line is employed to transmit the Nth gate signal;

a first input unit, electrically connected to the pull-up unit, for outputting the Nth driving control voltage according to an (N−1)th driving control signal and an (N−1)th gate signal of the gate signals, the first input unit comprising:
a first transistor having a first end electrically connected to an (N−1)th shift register stage of the shift register stages for receiving the (N−1)th gate signal, a gate end electrically connected to the (N−1)th shift register stage for receiving the (N−1)th driving control signal, and a second end;
a second transistor having a first end electrically connected to the second end of the first transistor, a gate end electrically connected to the first end of the first transistor, and a second end for outputting the Nth driving control voltage; and
a third transistor having a first end electrically connected to the first end of the first transistor, a gate end electrically connected to the gate end of the second transistor, and a second end electrically connected to the second end of the first transistor; and a second input unit, electrically connected to the pull-up unit, for outputting the Nth driving control voltage according to a second input signal and a second control signal having a phase opposite to the (N−1)th driving control signal, the second input unit comprising:
a fourth transistor having a first end for receiving the second input signal, a gate end for receiving the second control signal, and a second end;
a fifth transistor having a first end electrically connected to the second end of the fourth transistor, a gate end electrically connected to the first end of the fourth transistor, and a second end for outputting the Nth driving control voltage; and
a sixth transistor having a first end electrically connected to the first end of the fourth transistor, a gate end electrically connected to the gate end of the fifth transistor, and a second end electrically connected to the second end of the fourth transistor.

9. The shift register circuit of claim 8, wherein the first end of the fourth transistor is electrically connected to an (N+1)th shift register stage of the shift register stages for receiving an (N+1)th gate signal of the gate signals.

10. The shift register circuit of claim 8, further comprising:

a first pull-down unit, electrically connected to the first input unit and the second input unit, for pulling down the Nth driving control voltage according to a third input signal;

a second pull-down unit, electrically connected to the first input unit, the second input unit and the Nth gate line, for pulling down the Nth gate signal according to the Nth driving control voltage; and a third pull-down unit, electrically connected to the first input unit and the second input unit, for pulling down the Nth driving control voltage according to a fourth input signal.

11. The shift register circuit of claim 10, wherein:

the first end of the fourth transistor is electrically connected to an (N+1)th shift register stage of the shift register stages for receiving an (N+1)th gate signal of the gate signals;

the first pull-down unit comprises a seventh transistor having a first end electrically connected to the first and second input units, a gate end connected to an (N+2)th shift register stage of the shift register stages for receiving an (N+2)th gate signal of the gate signals, and a second end for receiving a power voltage;

the third pull-down unit comprises an eighth transistor having a first end electrically connected to the first and second input units, a gate end connected to an (N−2)th shift register stage of the shift register stages for receiving an (N−2)th gate signal of the gate signals, and a second end for receiving the power voltage; and the pull-up unit comprises a ninth transistor having a first end for receiving the system clock, a second end electrically connected to the Nth gate line, and a gate end for receiving the Nth driving control voltage.

12. The shift register circuit of claim 8, further comprising:

a first pull-down unit, electrically connected to the first input unit, for pulling down the Nth driving control voltage according to an (N+1)th gate signal of the gate signals which is generated by an (N+1)th shift register stage of the shift register stages; and a second pull-down unit, electrically connected to the first input unit and the Nth gate line, for pulling down the Nth gate signal according to the Nth driving control voltage.

* * * * *